US012722203B2

(12) United States Patent
Wei et al.

(10) Patent No.: US 12,722,203 B2
(45) Date of Patent: Sep. 1, 2026

(54) INTELLIGENT TEMPERATURE CONTROL LATTICE STRUCTURE BASED ON 4D PRINTING AND APPLICATION THEREOF

(71) Applicant: SHENYANG RESEARCH INSTITUTE OF FOUNDRY CO., LTD. CAM, Liaoning (CN)

(72) Inventors: Yanpeng Wei, Liaoning (CN); Bo Yu, Liaoning (CN); Yingchun Ma, Liaoning (CN); Jingchang Cheng, Liaoning (CN); Jian Shi, Liaoning (CN); Peng Gao, Liaoning (CN); Zhiquan Miao, Liaoning (CN); Shuwen Guan, Liaoning (CN)

(73) Assignee: SHENYANG RESEARCH INSTITUTE OF FOUNDRY CO., LTD. CAM, Liaoning (CN)

( * ) Notice: Subject to any disclaimer, the term of this patent is extended or adjusted under 35 U.S.C. 154(b) by 0 days.

(21) Appl. No.: 18/840,810

(22) PCT Filed: Feb. 8, 2024

(86) PCT No.: PCT/CN2024/076938

§ 371 (c)(1),
(2) Date: Aug. 22, 2024

(87) PCT Pub. No.: WO2024/198755

PCT Pub. Date: Oct. 3, 2024

(65) Prior Publication Data

US 2026/0084213 A1 Mar. 26, 2026

(30) Foreign Application Priority Data

Mar. 24, 2023 (CN) ........................ 202310293117.2

(51) Int. Cl.
*B22F 10/28* (2021.01)
*B22F 10/64* (2021.01)
(Continued)

(52) U.S. Cl.
CPC .............. *B22F 10/28* (2021.01); *B22F 10/64* (2021.01); *B22F 10/80* (2021.01); *B33Y 10/00* (2014.12);
(Continued)

(58) Field of Classification Search
CPC .......... B22F 10/28; B22F 10/64; B22F 10/80; B33Y 10/00; B33Y 50/00; B33Y 40/20;
(Continued)

(56) References Cited

U.S. PATENT DOCUMENTS 10,303,157 B2 * 5/2019 Huang ............... G05B 19/4099
2017/0151733 A1 * 6/2017 Lewis ................. B29C 71/0009
(Continued)

FOREIGN PATENT DOCUMENTS

CN 109746445 A 5/2019
CN 111842888 A 10/2020
(Continued)

*Primary Examiner* — Joel M Attey
(74) *Attorney, Agent, or Firm* — Umberg Zipser LLP; Ryan Dean

(57) ABSTRACT

An intelligent temperature control lattice structure based on 4D printing and an application thereof are disclosed. The lattice structure includes lattice metal and a liquid storage chamber. The lattice metal is an integral closed structure formed by expanding a lattice cell with a tetrakaidecahedron shell and six holes in connection, and the liquid storage chamber is in connection with the lattice metal. The method for manufacturing the lattice structure includes: establishing a three-dimensional model of the lattice structure; slicing the three-dimensional model and manufacturing the lattice structure by using a selective laser melting additive manu-
(Continued)

facturing process characterized by a high volumetric energy density, a low laser power and a low scanning speed; carrying out solution treatment on the obtained lattice structure; injecting cooling liquid into the liquid storage chamber and then closing openings on the lattice metal by cold pressing under a normal temperature condition.

4 Claims, 3 Drawing Sheets

(51) Int. Cl.

| | |
|---|---|
| ***B22F 10/80*** | (2021.01) |
| ***B33Y 10/00*** | (2015.01) |
| ***B33Y 40/20*** | (2020.01) |
| ***B33Y 50/00*** | (2015.01) |
| ***B64C 1/40*** | (2006.01) |
| *B64C 1/36* | (2006.01) |
| *B64C 1/38* | (2006.01) |
| *B64G 1/58* | (2006.01) |
| *F25D 7/00* | (2006.01) |
| *F42B 15/34* | (2006.01) |
| *H10W 40/70* | (2026.01) |

(52) U.S. Cl.
CPC ............... *B33Y 40/20* (2020.01); *B33Y 50/00* (2014.12); *B64C 1/40* (2013.01); *B64C 1/36* (2013.01); *B64C 1/38* (2013.01); *B64G 1/58* (2013.01); *F25D 7/00* (2013.01); *F42B 15/34* (2013.01); *H10W 40/70* (2026.01)

(58) Field of Classification Search
CPC ... B64C 1/40; B64C 1/38; B64C 1/36; H10W 40/70; B64G 1/58; F42B 15/34; F25D 7/00
USPC .......................................................... 165/132
See application file for complete search history.

(56) References Cited

U.S. PATENT DOCUMENTS

| | | | | |
|---|---|---|---|---|
| 2020/0131383 | A1* | 4/2020 | Ke | B29C 64/106 |
| 2022/0314183 | A1* | 10/2022 | Yee | H01M 4/48 |
| 2025/0058520 | A1* | 2/2025 | Scheideler | C23C 16/34 |

FOREIGN PATENT DOCUMENTS

| | | | |
|---|---|---|---|
| CN | 112008081 | A | 12/2020 |
| CN | 112475319 | A | 3/2021 |
| CN | 112492864 | A | 3/2021 |
| CN | 116021036 | A | 4/2023 |

* cited by examiner

INTELLIGENT TEMPERATURE CONTROL LATTICE STRUCTURE BASED ON 4D PRINTING AND APPLICATION THEREOF

TECHNICAL FIELD

The present disclosure belongs to the technical field of additive manufacturing of lattice metal, and in particular relates to a 4D-printed lattice structure with intelligent temperature control function and a manufacturing method thereof.

BACKGROUND

In recent years, with the continuous development of aeronautics and aerospace technology, the demand for high-end temperature-resistant components of flight vehicles is increasing. During the flight of an aerospace flight vehicle, such as a high-speed or supersonic flight vehicle, the pulsation and vibration of the vehicle combustion very easily leads to overly high local heat flux density and overly high temperature on the external surface of the vehicle. During the flight of the vehicle, due to the friction with air, the external surface temperature of the vehicle is often higher than 1000 K, which has laid a great hidden danger for the normal operation of the precise aeronautics or aerospace flight vehicle.

In order to avoid the influence of excessive external surface temperature on the flight safety of aeronautics or aerospace flight vehicles, the following two approaches are usually used at home and abroad. The first approach adopts a passive cooling mode with which, by improving the high-temperature resistance of the aeronautics and aerospace materials structure, the influence of external temperature on the internal structure of the flight vehicle is avoided, and the internal temperature stability of the vehicle is maintained. This approach is the most commonly used local "cooling" method at present. Such type of high-temperature resistant materials are generally formed as a composition of high-temperature alloys and ceramic materials, and the heavy mass and huge volume of these materials would seriously hinder the further development of the aeronautics or aerospace flight vehicles. The second approach adopts active cooling functional structural components, with which temperature control of the external surface of the flight vehicle is usually realized through the ejecting flow of cooling liquid in the structures controlled by electrical circuits. Such temperature control structural components usually include electrical circuits, water tanks, pipes and other equipment parts, and the complex equipment structure would seriously limit their further application.

Lattice structure is well known for its high degree of freedom in designability. By regulating characteristics such as lattice cell, pore structure and matrix composition, various functional requirements of a complex part structure can be realized. lattice metal with metal as the matrix material is a new ordered porous material with integrated structure and function. Compared with traditional metal materials, lattice metal has great advantages in aspects such as light weight, strength and functionality, and has attracted wide attention as a lightweight material. Lattice metal structures are also often used in aeronautics and aerospace, equipment manufacturing and other military fields.

However, the traditional manufacturing process is difficult to meet the requirement of precise forming of complex structures such as metal lattice structures. Additive manufacturing technology (3D printing) provides a new idea for the design of high-performance metal lattice structure. On the basis of 3D printing, the components made by 4D printing can change in aspects such as shape and performance under stimulation from a specific environment, such as heat, magnetism, light and sound. It is found in research that some alloys, such as Ni—Ti-based, Cu-based, Fe-based and other metal systems, cause transformation between martensite and austenite under stimulation of external temperature to realize shape change and recovery, and therefore show shape memory effect. The lattice structure made by 4D printing and with shape memory alloy as the matrix provides a new idea for the research and development for realizing temperature control functional structural components, which breaks through the technical bottleneck of practical application of 4D printed structures in the field of temperature control, and is beneficial to further iterative upgrade of aeronautics or aerospace flight vehicles.

SUMMARY

In view of the shortcomings of the existing technology and the urgent demand of the aeronautics and aerospace industry for high-performance temperature control structural components, an intelligent temperature control lattice structure based on 4D printing and its application are provided, which break through the technical bottleneck of design and manufacturing of active cooling lattice structure and meet the urgent demand for high-temperature service parts under extreme environmental conditions such as in the aeronautics and aerospace field.

In accordance with an aspect of the present disclosure, a lattice structure with intelligent temperature control function is designed. The lattice structure, when in an environment of room temperature, is a completely closed lattice structure filled with cooling liquid inside. When the ambient temperature reaches a preset response temperature, the openings of the lattice metal will automatically open, and the cooling liquid in the liquid storage chamber will be ejected to realize the temperature control function.

In accordance with another aspect of the present disclosure, the manufacturing of the intelligent temperature control lattice structure is realized by 4D printing, and, according to application requirements, the preset response temperature of the intelligent temperature control lattice structure is effectively regulated through changing process parameters of additive manufacturing as well as process parameters of heat treatment and related post-treatment. Based on a selective laser melting additive manufacturing process, and adopting additive manufacturing process parameters including high volumetric energy density, low laser power and low scanning speed, the phase transition temperature of nickel-titanium matrix material is effectively improved, so that the preset response temperature of intelligent temperature control lattice structure is improved to an application level.

A technical solution of the present disclosure is as follows.

An intelligent temperature control lattice structure based on 4D printing is provided, the lattice structure including lattice metal and a liquid storage chamber, the lattice metal is an integral closed structure formed by extending a lattice cell with a tetrakaidecahedron shell and six holes in connection, and the liquid storage chamber is in connection with the lattice metal;

the lattice structure is manufactured by a selective laser melting additive manufacturing process with following specific steps:

step 1, carrying out process adaptability design on pore structure for the lattice structure with three-dimensional design software, and establishing a three-dimensional model of the lattice structure;

step 2, slicing the three-dimensional model of the lattice structure established in step 1 with slicing software, and manufacturing the lattice structure by using the selective laser melting additive manufacturing process characterized by a high volumetric energy density, a low laser power and a low scanning speed, the high volumetric energy density being 250 $J/mm^3$~400 $J/mm^3$, the low laser power being 60 W~100 W, and the low scanning speed being 80~200 mm/s;

step 3, carrying out solution treatment on the lattice structure obtained in step 2, the temperature for the solution treatment being 800° C.~1100° C., and the duration for the solution treatment being 1 h~15 h;

step 4, injecting cooling liquid into the liquid storage chamber and then closing the openings in the lattice metal by cold pressing under a normal temperature condition.

Preferred technical solutions are provided as follows.

In step 2, other process parameters of the selective laser melting additive manufacturing process are: hatch spacing being 40 μm~125 μm, hatch angle being 45°~90°, and layer thickness being 20 μm~50 μm.

The unit cell of the lattice metal is an open polyhedron structure with a tetrakaidecahedron shell and six holes in connection. The porosity of lattice metal ranges from 35%~90%, the plate shell thickness of the lattice structure is 0.5 mm~2 mm, and the diagonal length of the openings of the lattice metal is 0.5 mm~2 mm.

The matrix material of the intelligent temperature control lattice structure is nickel-titanium shape memory alloy powder, the mass fraction of nickel in the nickel-titanium shape memory alloy is 55.08%~56.10%, and the particle size of the alloy powder is 15 μm~53 μm.

The cooling liquid is water or paraffin.

When the ambient temperature excitation of the intelligent temperature control lattice structure reaches the preset response temperature, the lattice metal openings automatically open, and the cooling liquid in the liquid storage chamber is ejected from the openings of the lattice metal to realize the temperature control function.

The preset response temperature range is 15° C.~80° C.

The intelligent temperature control lattice structure based on 4D printing according to the present disclosure can be used for manufacturing a high-temperature service part of an aerospace flight vehicle.

The present disclosure has following advantages and beneficial effects.

1. Intelligent open and closing of openings of the lattice metal: according to the present disclosure, a brand-new intelligent temperature control lattice structure is provided, the shape memory effect of shape memory alloy under a temperature excitation condition is used, the intelligent temperature control lattice structure is manufactured combining the selective laser melting additive manufacturing process, and complete closing of the openings of the lattice metal is realized by post-processing processes such as cold pressing. Under the temperature excitation condition, the openings of the lattice metal can be automatically opened or closed to realize the intelligent temperature control function, and the cooling liquid discharge speed when the lattice structure works can be regulated by regulating the porosity, the plate shell thickness and the size of the openings of the lattice metal.

2. The preset response temperature can be regulated: the present disclosure realizes the effective regulation of the phase change temperature of the lattice structure by changing the additive manufacturing process parameters. By regulating the additive manufacturing process parameters for high volumetric energy density, low laser power and low scanning speed, and by adjusting and controlling the subsequent solution treatment process parameters, the present disclosure improves the phase change temperature of the lattice structure to the preset response temperature. The additive manufacturing process, heat treatment and related post-treatment process are designed as a whole, so that the preset response temperature of the intelligent temperature control lattice structure is adjustable within a preset response temperature range of 15° C.~80° C., which meets the application requirements of the intelligent temperature control lattice structure.

3. Light weight and low density: the intelligent temperature control lattice structure according to the present disclosure has light overall weight and low density. Compared with the passive cooling structures composed of temperature-resistant materials and the active cooling structures composed of complex pipelines used in high-temperature environment, the solution of the present disclosure greatly reduces the energy consumption of materials in service on the flight vehicle.

4. Strong designability: according to the present disclosure, combining the characteristics of the additive manufacturing process, an intelligent temperature control functional component including lattice metal and liquid storage chambers is designed and manufactured by using selective laser melting additive manufacturing process, which avoids the complex arrangement requirements of lines, water tanks, pipelines and other parts inside common temperature control functional components of the same type, and effectively avoids the problems of excessive weight and volume during use. In the preparation process, there is no mold processing, and the preparation process is not restricted by alloy system and workpiece shape. The integral structural component is manufactured by additive manufacturing process, and there is no need for additional processing steps such as welding, and there is high design freedom. The morphology of intelligent temperature control lattice structure can be adjusted freely according to different application scenarios.

DETAILED DESCRIPTION OF THE EMBODIMENTS

Figure 1:
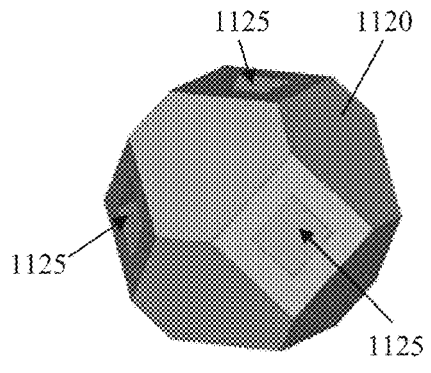
FIG. 1 is an axonometric view of the design model of a unit cell of the intelligent temperature control lattice structure.

The method of manufacturing of the present disclosure will be described in detail below with reference to the attached drawings. The examples given are only for explaining the present disclosure, not for limiting the scope of the present disclosure. The lattice structure is an integral structural component manufactured by the additive manufacturing process, and there is no need for additional processing steps such as welding.

In accordance with an embodiment of the present disclosure, an intelligent temperature control lattice structure based on 4D printing is provided, the lattice structure including lattice metal and a liquid storage chamber, the lattice metal is an integral closed structure formed by extending a lattice cell with a tetrakaidecahedron shell and six holes in connection, and the liquid storage chamber is in connection with the lattice metal;

the lattice structure 100 is manufactured by the selective laser melting additive manufacturing process with following specific steps:

step 1, carrying out process adaptability design on pore structure for the lattice structure with three-dimensional design software, and establishing a three-dimensional model of the lattice structure; the unit cell 112 of the lattice metal 110 is an open polyhedron structure with a tetrakaidecahedron shell 1120 and six holes 1125 in connection; the porosity of lattice metal 110 ranges from 35%~90%, the plate shell thickness D1 of the lattice structure is 0.5 mm~2 mm, and the diagonal length Li of the openings as liquid outlets of the lattice metal 110 is 0.5 mm~2 mm;

step 2, slicing the three-dimensional model of the lattice structure established in step 1 with slicing software, and manufacturing the lattice structure by using the selective laser melting additive manufacturing process characterized by a high volumetric energy density, a low laser power and a low scanning speed; the matrix material of the lattice structure is nickel-titanium shape memory alloy powder, and the mass fraction of nickel in the nickel-titanium shape memory alloy is 55.08%~56.10%, and the particle size of the alloy powder is 15 μm 53 μm; the high volumetric energy density is 250 J/mm$^3$~400 J/mm$^3$, the low laser power is 60 W~100 W, and the low scanning speed is 80~200 mm/s; other process parameters are: hatch spacing being 40 μm~125 μm, hatch angle being 45°~90°, and layer thickness being 20 μm~50 μm;

step 3, carrying out solution treatment on the lattice structure obtained in step 2, the temperature for the solution treatment being 800° C.~1100° C., and the duration for the solution treatment being 1 h~15 h;

step 4, injecting cooling liquid into the liquid storage chambers and then closing the openings in the lattice structure by cold pressing under a normal temperature condition.

Embodiment One

Figure 3:
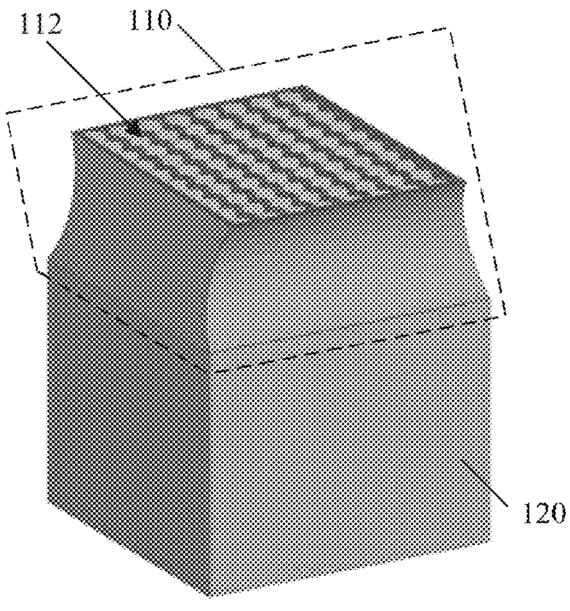
FIG. 3 is a schematic diagram of the overall model structure of the intelligent temperature control lattice structure.
Figure 4:
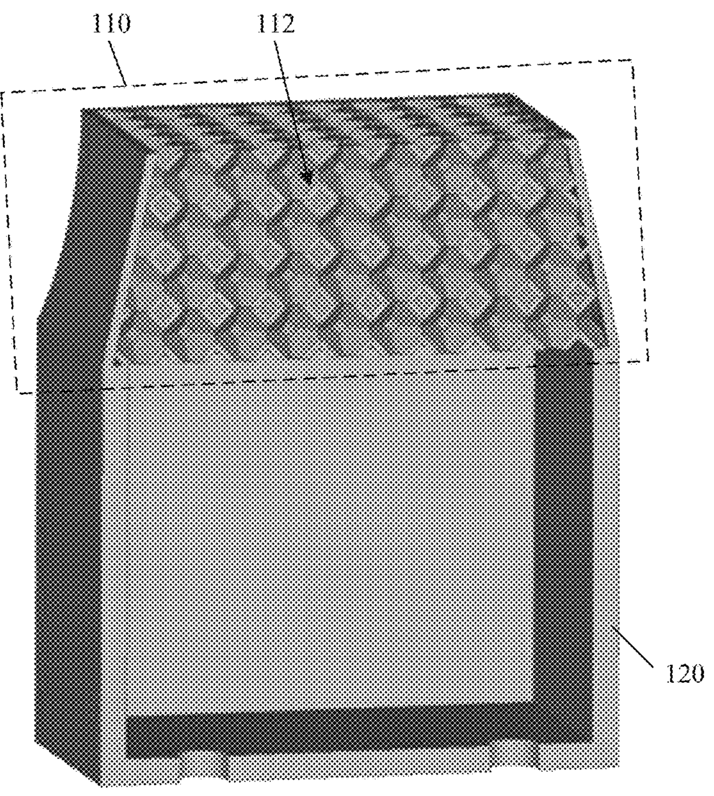
FIG. 4 is a sectional view of the overall model of the intelligent temperature control lattice structure.

This embodiment involves design and manufacturing of an intelligent temperature control lattice structure with a porosity of 35%. The structural morphology of the intelligent temperature control lattice structure is shown in FIGS. 3 and 4. In this embodiment, the preset response temperature is 65° C. After the ambient temperature reaches the preset response temperature, the openings of the intelligent temperature control lattice structure 100 automatically open and the cooling liquid is ejected to realize the intelligent temperature control function.

Figure 2:
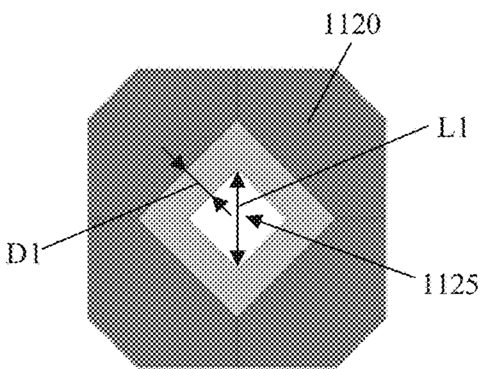
FIG. 2 is a front view of the design model of the unit cell of the intelligent temperature control lattice structure.
Figure 5:
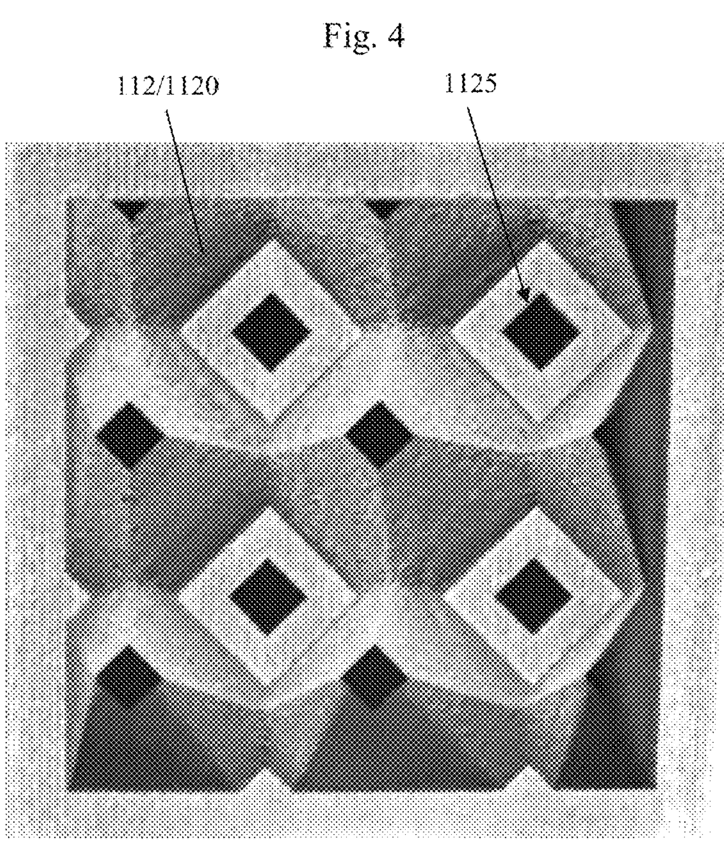
FIG. 5 is a schematic diagram of a sample of the intelligent temperature control lattice structure.

The intelligent temperature control lattice structure 100 is manufactured by the selective laser melting additive manufacturing process with following specific steps:

step 1, carrying out process adaptability design on pore structure for the lattice structure 100 with intelligent temperature control function with three-dimensional design software, and establishing a three-dimensional model of the lattice structure 100; the intelligent temperature control lattice structure is composed of lattice metal 110 extended from a unit cell 112 shown in FIG. 1 and FIG. 2 and liquid storage chambers 120; the plate shell thickness D1 of a unit cell 112 of the lattice metal 110 is 2 mm, and the diagonal length Li of the openings of the lattice metal 110 is 0.5 mm;

step 2, slicing the three-dimensional model of the intelligent temperature control lattice structure established in step 1 with slicing software, forming the lattice structure 100 consisting of lattice-structure metal 110 and liquid storage chambers 120 from the matrix material powder by selective laser melting additive manufacturing process; the matrix material powder is nickel-titanium alloy powder with a particle size of 15 μm~53 μm, the mass fraction of nickel element being 55.08%; the process parameters of the selective laser melting additive manufacturing are: volumetric energy density of 300 J/mm$^3$, laser power of 60 W, scanning speed of 80 mm/s, hatch spacing of 125 μm, hatch angle of 45° and layer thickness of 20 μm;

step 3, carrying out solution treatment on the lattice structure obtained in step 2, the temperature for the solution treatment being 1100° C., and the duration for the solution treatment being 15 h; the sample of the lattice structure 100 obtained after solution treatment is shown in FIG. 5;

step 4, injecting cooling liquid into the liquid storage chambers 120 and then closing the openings in the intelligent temperature control lattice metal 110 by cold pressing under a normal temperature condition, the cooling liquid being water.

For the intelligent temperature control lattice structure 100 manufactured according to this embodiment, after the external temperature reaches the preset response temperature, the cooling liquid in the liquid storage chambers 120 will be ejected from the openings of the lattice metal 110, thus realizing the intelligent temperature control function of the structure.

Embodiment Two

This embodiment involves design and manufacturing of an intelligent temperature control lattice structure with a porosity of 67%. The preset response temperature is 80° C. After the ambient temperature reaches the preset response temperature, the openings of the intelligent temperature control lattice structure automatically open and the cooling liquid is ejected to realize the intelligent temperature control function.

Figure 6:
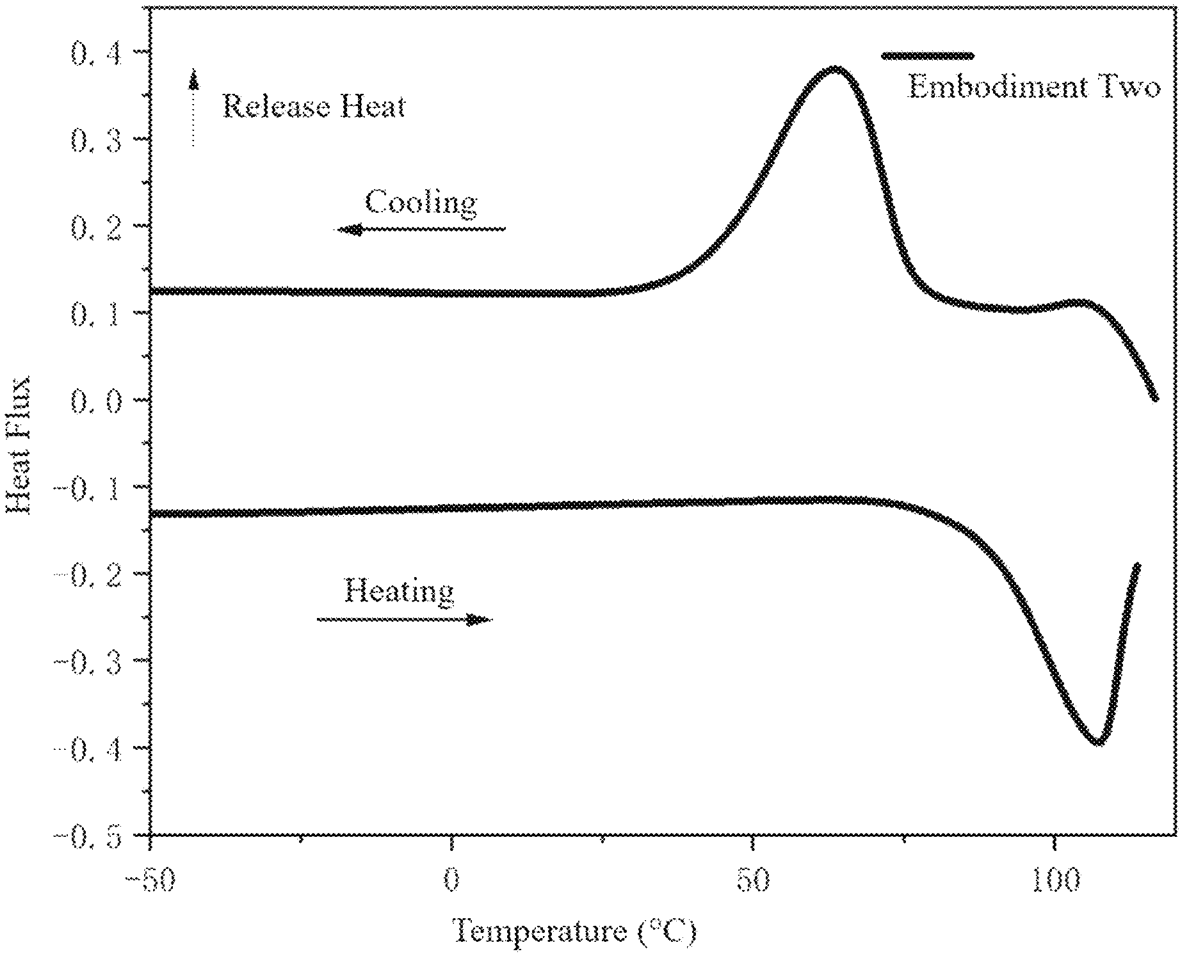
FIG. 6 is the DSC curve of the matrix material of the intelligent temperature control lattice structure.

The intelligent temperature control lattice structure is manufactured by the selective laser melting additive manufacturing process with following specific steps:

step 1, carrying out process adaptability design on pore structure for the lattice structure with intelligent temperature control function with three-dimensional design software, and establishing a three-dimensional model of the lattice structure; the intelligent temperature control lattice structure is composed of lattice metal extended from a unit cell and liquid storage chambers; the plate shell thickness of a unit cell of the lattice metal is 1 mm, and the diagonal length of the openings of the lattice metal is 1 mm;

step 2, slicing the three-dimensional model of the intelligent temperature control lattice structure established in step 1 with slicing software, forming the lattice structure consisting of lattice structure and liquid storage chambers from the matrix material powder by selective laser melting additive manufacturing process; the matrix material powder is nickel-titanium alloy powder with a particle size of 15 μm~53 μm, the mass fraction of nickel element being 55.71%; the process parameters of the selective laser melting additive manufacturing are: volumetric energy density of 400 J/mm$^3$, laser power of 80 W, scanning speed of 100 mm/s, hatch spacing of 40 μm, hatch angle of 90° and layer thickness of 50 μm;

step 3, carrying out solution treatment on the lattice structure obtained in step 2, the temperature for the solution treatment being 1000° C., and the duration for the solution treatment being 10 h; after the solution treatment, the samples processed by wire cutting are tested by DSC, and the results are shown in FIG. 6; at this time, the phase transition temperature of the lattice structure is 80° C.;

step 4, injecting cooling liquid into the liquid storage chambers and then closing the openings in the intelligent temperature control lattice metal by cold pressing under a normal temperature condition, the cooling liquid being paraffin.

For the intelligent temperature control lattice structure manufactured according to this embodiment, after the external temperature reaches the preset response temperature, the cooling liquid in the liquid storage chambers will be ejected from the openings of the lattice metal, thus realizing the intelligent temperature control function of the structure.

Comparative Example One

This experiment is a comparative example of embodiment two. Compared with embodiment two, this comparative example adopts higher volumetric energy density and laser power in the additive manufacturing process, the high volumetric energy density and the high laser power which being 500 J/mm$^3$ and 100 W respectively, and other experimental parameters are completely consistent with embodiment two.

This comparative example involves design and manufacturing of an intelligent temperature control lattice structure with a porosity of 67%. The intelligent temperature control lattice structure is manufactured by the selective laser melting additive manufacturing process with following specific steps:

step 1, carrying out process adaptability design on pore structure for the lattice structure with intelligent temperature control function with three-dimensional design software, and establishing a three-dimensional model of the lattice structure; the intelligent temperature control lattice structure is composed of lattice metal extended from a unit cell and liquid storage chambers; the plate shell thickness of a unit cell of the lattice metal is 1 mm, and the diagonal length of the openings of the lattice metal is 1 mm;

step 2, slicing the three-dimensional model of the intelligent temperature control lattice structure established in step 1 with slicing software, forming the lattice structure consisting of lattice structure and liquid storage chambers from the matrix material powder by selective laser melting additive manufacturing process; the matrix material powder is nickel-titanium alloy powder with a particle size of 15 μm~53 μm, the mass fraction of nickel element being 55.71%; the process parameters of the selective laser melting additive manufacturing are respectively: volumetric energy density of 500 J/mm$^3$, laser power of 100 W, scanning speed of 100 mm/s, hatch spacing of 40 μm, hatch angle of 900 and layer thickness of 50 μm;

step 3, carrying out solution treatment on the lattice structure obtained in step 2, the temperature for the solution treatment being 1000° C., and the duration for the solution treatment being 10 h;

step 4, injecting cooling liquid into the liquid storage chambers and then closing the openings in the intelligent temperature control lattice metal by cold pressing under a normal temperature condition, the cooling liquid being paraffin.

For the intelligent temperature control lattice structure manufactured according to this comparative example, during the printing and forming process in step 2, a large number of defective holes can be observed on the surface. Because the energy for forming is too high, the material melts excessively, the diagonal length of the openings of the lattice is only about 0.2 mm, and the size of the openings is much smaller than the pre-designed size. In addition, the lattice structure is broken on the whole structure during the cold pressing process in step 4, which cannot meet the application requirements.

Embodiment Three

This embodiment involves design and manufacturing of an intelligent temperature control lattice structure with a porosity of 90%. The preset response temperature is 15° C. After the ambient temperature reaches the preset response temperature, the openings of the intelligent temperature control lattice structure automatically open and the cooling liquid is ejected to realize the intelligent temperature control function.

The intelligent temperature control lattice structure is manufactured by the selective laser melting additive manufacturing process with following specific steps:

step 1, carrying out process adaptability design on pore structure for the lattice structure with intelligent temperature control function with three-dimensional design software, and establishing a three-dimensional model of the lattice structure; the intelligent temperature control lattice structure is composed of lattice metal extended from a unit cell and liquid storage chambers; the plate shell thickness of a unit cell of the lattice metal is 0.5 mm, and the diagonal length of the openings of the lattice metal is 2 mm;

step 2, slicing the three-dimensional model of the intelligent temperature control lattice structure established in step 1 with slicing software, forming the lattice structure consisting of lattice structure and liquid storage chambers from the matrix material powder by selective laser melting additive manufacturing process; the matrix material powder is nickel-titanium alloy powder with a particle size of 15 μm~53 μm, the mass fraction of nickel element being 56.10%; the process parameters of the selective laser melting additive manufacturing are respectively: volumetric energy density of 250 J/mm$^3$, laser power of 100 W, scanning speed of 200 mm/s, hatch spacing of 66 μm, hatch angle of 75° and layer thickness of 30 μm;

step 3, carrying out solution treatment on the lattice structure obtained in step 2, the temperature for the solution treatment being 800° C., and the duration for the solution treatment being 1 h;

step 4, injecting cooling liquid into the liquid storage chambers and then closing the openings in the intelligent temperature control lattice metal by cold pressing under a normal temperature condition. In this embodiment, the cooling liquid in the liquid storage chambers of the intelligent temperature control lattice structure is water.

For the intelligent temperature control lattice structure manufactured according to the present disclosure, after the external temperature reaches the preset response temperature, the cooling liquid in the liquid storage chambers will be ejected from the openings of the lattice metal, thus realizing the intelligent temperature control function of the structure.

Comparative Example Two

This experiment is a comparative example of embodiment three. Compared with embodiment three, this comparative example adopts lower volumetric energy density and laser power in the additive manufacturing process, the low volumetric energy density and the low laser power being 100 J/mm$^3$ and 40 W respectively, and other experimental parameters are completely consistent with embodiment three.

This comparative example involves design and manufacturing of an intelligent temperature control lattice structure with a porosity of 90%. The intelligent temperature control lattice structure is manufactured by the selective laser melting additive manufacturing process with following specific steps:

step 1, carrying out process adaptability design on pore structure for the lattice structure with intelligent temperature control function with three-dimensional design software, and establishing a three-dimensional model of the lattice structure; the intelligent temperature control lattice structure is composed of lattice metal extended from a unit cell and liquid storage chambers; the plate shell thickness of a unit cell of the lattice metal is 0.5 mm, and the diagonal length of the openings of the lattice metal is 2 mm;

step 2, slicing the three-dimensional model of the intelligent temperature control lattice structure established in step 1 with slicing software, forming the lattice structure consisting of lattice structure and liquid storage chambers from the matrix material powder by selective laser melting additive manufacturing process; the matrix material powder is nickel-titanium alloy powder with a particle size of 15 μm~53 μm, the mass fraction of nickel element being 56.10%; the process parameters of the selective laser melting additive manufacturing are respectively: volumetric energy density of 100 J/mm$^3$, laser power of 40 W, scanning speed of 200 mm/s, hatch spacing of 66 μm, hatch angle of 75° and layer thickness of 30 μm;

step 3, carrying out solution treatment on the lattice structure obtained in step 2, the temperature for the solution treatment being 800° C., and the duration for the solution treatment being 1 h;

step 4, injecting cooling liquid into the liquid storage chambers and then closing the openings in the intelligent temperature control lattice metal by cold pressing under a normal temperature condition. In this embodiment, the cooling liquid in the liquid storage chambers of the intelligent temperature control lattice structure is water.

The DSC test results of the intelligent temperature control lattice structure manufactured in this comparative example and after heat treatment in step 3 show that the phase transition temperature of the material is −21.5° C. Therefore, the lattice structure after cold pressing in step 4 does not show shape memory effect at room temperature or high temperature such as the preset response temperature of 15~80° C., and cannot realize automatic opening or closing of the openings of the lattice metal at the preset response temperature.

Comparative Example Three

This experiment is a comparative example of embodiment three. Compared with embodiment three, this comparative example adopts higher scanning speed and lower laser power in the additive manufacturing process, the high scanning speed being 250 mm/s, which exceeds the upper limit of the scanning speed required by the claims, and the low laser power being 80 W, which still complies with the laser power limit in the claims, and other experimental parameters are completely consistent with embodiment three.

This comparative example involves design and manufacturing of an intelligent temperature control lattice structure with a porosity of 90%. The intelligent temperature control lattice structure is manufactured by the selective laser melting additive manufacturing process with following specific steps:

step 1, carrying out process adaptability design on pore structure for the lattice structure with intelligent temperature control function with three-dimensional design software, and establishing a three-dimensional model of the lattice structure; the intelligent temperature control lattice structure is composed of lattice metal extended from a unit cell and liquid storage chambers; the plate shell thickness of a unit cell of the lattice metal is 0.5 mm, and the diagonal length of the openings of the lattice metal is 2 mm;

step 2, slicing the three-dimensional model of the intelligent temperature control lattice structure established in step 1 with slicing software, forming the lattice structure consisting of lattice structure and liquid storage chambers from the matrix material powder by selective laser melting additive manufacturing process; the matrix material powder is nickel-titanium alloy powder with a particle size of 15 μm~53 μm, the mass fraction of nickel element being 56.10%; the process parameters of the selective laser melting additive manufacturing are respectively: volumetric energy density of 250 J/mm$^3$, laser power of 80 W, scanning speed of 250 mm/s, hatch spacing of 66 μm, hatch angle of 75° and layer thickness of 30 μm;

step 3, carrying out solution treatment on the lattice structure obtained in step 2, the temperature for the solution treatment being 800° C., and the duration for the solution treatment being 1 h;

step 4, injecting cooling liquid into the liquid storage chambers and then closing the openings in the intelligent temperature control lattice metal by cold pressing under a normal temperature condition, the cooling liquid being water.

The DSC test results of the intelligent temperature control lattice structure manufactured in this comparative example and after heat treatment in step 3 show that the phase transition temperature of the material is −15.3° C. Therefore, the lattice structure after cold pressing in step 4 does not show shape memory effect at room temperature or high temperature such as the preset response temperature of 15~80° C., and cannot realize automatic opening or closing of the openings of the lattice metal at the preset response temperature.

Comparative Example Four

This experiment is a comparative example of embodiment three. Compared with embodiment three, the raw material powder used in the additive manufacturing process of this comparative example is nickel-titanium shape memory alloy powder with a mass fraction of 56.25%, and the particle size of the powder is 15 μm~53 μm. Other experimental parameters are completely consistent with embodiment three.

This comparative example involves design and manufacturing of an intelligent temperature control lattice structure with a porosity of 90%. The intelligent temperature control lattice structure is manufactured by the selective laser melting additive manufacturing process with following specific steps:

- step 1, carrying out process adaptability design on pore structure for the lattice structure with intelligent temperature control function with three-dimensional design software, and establishing a three-dimensional model of the lattice structure; the intelligent temperature control lattice structure is composed of lattice metal extended from a unit cell and liquid storage chambers; the plate shell thickness of a unit cell of the lattice metal is 0.5 mm, and the diagonal length of the openings of the lattice metal is 2 mm;
- step 2, slicing the three-dimensional model of the intelligent temperature control lattice structure established in step 1 with slicing software, forming the lattice structure consisting of lattice structure and liquid storage chambers from the matrix material powder by selective laser melting additive manufacturing process; the matrix material powder is nickel-titanium alloy powder with a particle size of 15 μm~53 μm, the mass fraction of nickel element being 56.25%; the process parameters of the selective laser melting additive manufacturing are respectively: volumetric energy density of 250 $J/mm^3$, laser power of 100 W, scanning speed of 200 mm/s, hatch spacing of 66 μm, hatch angle of 75° and layer thickness of 30 μm;
- step 3, carrying out solution treatment on the lattice structure obtained in step 2, the temperature for the solution treatment being 800° C., and the duration for the solution treatment being 1 h;
- step 4, injecting cooling liquid into the liquid storage chambers and then closing the openings in the intelligent temperature control lattice metal by cold pressing under a normal temperature condition, the cooling liquid being water.

The DSC test results of the intelligent temperature control lattice structure manufactured in this comparative example and after heat treatment in step 3 show that the phase transition temperature of the material is −37.5° C. Therefore, the lattice structure after cold pressing in step 4 does not show shape memory effect at room temperature or high temperature such as the preset response temperature of 15~80° C., and cannot realize automatic opening or closing of the openings of the lattice metal at the preset response temperature.

The above embodiments are only for explaining the technical concept and characteristics of the present disclosure, and the purpose of the above embodiments is to enable people familiar with the technology to understand the content of the present disclosure and implement it accordingly, without limiting the protection scope of the present disclosure. All equivalent changes or modifications made according to the spirit of the present disclosure should be included in the protection scope of the present disclosure.

In addition, descriptions of well-known structures and technologies are omitted herein to avoid unnecessarily confusing the concepts of the present disclosure.

What is claimed is:

1. An intelligent temperature control lattice structure based on 4D printing, wherein the lattice structure comprises a lattice metal and a liquid storage chamber, wherein the lattice metal is an integral closed structure formed by extending a unit cell with a tetrakaidecahedron shell and six holes in connection, a diagonal length of openings of the lattice metal is 0.5 mm-2 mm, and the liquid storage chamber is in connection with the lattice metal;

wherein the lattice structure is manufactured by a selective laser melting additive manufacturing process with following specific steps:

step 1, carrying out process adaptability design on pore structure for the lattice structure with three-dimensional design software, and establishing a three-dimensional model of the lattice structure;

step 2, slicing the three-dimensional model of the lattice structure established in step 1 with slicing software, and manufacturing the lattice structure using a selective laser melting additive manufacturing process characterized by a high volumetric energy density, a low laser power and a low scanning speed, wherein the high volumetric energy density is 250 $J/mm^3$~400 $J/mm^3$, the low laser power is 60 W~100 W, and the low scanning speed is 80~200 mm/s; the matrix material of the intelligent temperature control lattice structure is nickel-titanium shape memory alloy powder, and a mass fraction of nickel in the nickel-titanium shape memory alloy is 55.08%~56.10%, and a particle size of the alloy powder is 15 m~53 μm;

step 3, carrying out solution treatment on the lattice structure obtained in step 2, wherein a temperature for the solution treatment is 800° C.~1100° C., and a duration for the solution treatment is 1 h~15 h;

step 4, injecting cooling liquid into the liquid storage chamber and then closing the openings in the lattice metal by cold pressing under a normal temperature condition;

when an ambient temperature excitation of the intelligent temperature control lattice structure reaches a preset response temperature of 15° C.~80° C., the openings of the lattice metal automatically open, and the cooling liquid in the liquid storage chamber is ejected from the openings of the lattice metal to realize a temperature control function.

2. The intelligent temperature control lattice structure based on 4D printing according to claim 1, wherein in step 2, other process parameters of the selective laser melting additive manufacturing process are: hatch spacing being 40 μm~125 μm, hatch angle being 45° ~90°, and layer thickness being 20 μm~50 μm.

3. The intelligent temperature control lattice structure based on 4D printing according to claim 1, wherein the unit cell of the lattice metal is an open polyhedron structure with the tetrakaidecahedron shell and the six holes in connection, a porosity of the lattice metal ranges from 35%~90%, a plate shell thickness of the lattice structure is 0.5 mm~2 mm.

4. The intelligent temperature control lattice structure based on 4D printing according to claim 1, wherein the cooling liquid is water or paraffin.

* * * * *